United States Patent
Cho

(10) Patent No.: US 7,457,334 B2
(45) Date of Patent: Nov. 25, 2008

(54) SEMICONDUCTOR LASER DIODE PACKAGE

(75) Inventor: Soo-haeng Cho, Gyeonggi-do (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 245 days.

(21) Appl. No.: 11/128,311

(22) Filed: May 13, 2005

(65) Prior Publication Data

US 2005/0265410 A1  Dec. 1, 2005

(30) Foreign Application Priority Data

May 25, 2004  (KR) .................. 10-2004-0037323

(51) Int. Cl.
*H01S 3/04* (2006.01)
(52) U.S. Cl. ................... 372/36; 372/34; 257/276
(58) Field of Classification Search .......... 372/34–36; 257/276
See application file for complete search history.

(56) References Cited

U.S. PATENT DOCUMENTS

| | | | | |
|---|---|---|---|---|
| 6,301,278 | B2 * | 10/2001 | Uchida | 372/36 |
| 6,876,685 | B2 * | 4/2005 | Umemoto et al. | 372/43.01 |
| 6,940,091 | B2 * | 9/2005 | Funada et al. | 257/21 |
| 6,996,143 | B2 * | 2/2006 | Shiomoto | 372/36 |
| 7,046,707 | B2 * | 5/2006 | Koizumi | 372/43.01 |
| 7,158,550 | B2 * | 1/2007 | Keh et al. | 372/36 |
| 7,170,102 | B2 * | 1/2007 | Tsuji | 257/99 |
| 7,177,333 | B2 * | 2/2007 | Simoun-Ou et al. | 372/36 |
| 2003/0197254 | A1 * | 10/2003 | Huang | 257/678 |
| 2003/0231679 | A1 * | 12/2003 | Umemoto et al. | 372/43 |
| 2003/0235223 | A1 * | 12/2003 | Koizumi | 372/36 |
| 2005/0111503 | A1 * | 5/2005 | Ishigami et al. | 372/38.1 |
| 2005/0207459 | A1 * | 9/2005 | Yu et al. | 372/36 |

* cited by examiner

*Primary Examiner*—Minsun Harvey
*Assistant Examiner*—Yuanda Zhang
(74) *Attorney, Agent, or Firm*—Buchanan Ingersoll & Rooney PC

(57) ABSTRACT

Provided is a semiconductor laser diode package. The semiconductor laser diode package may include: a stem having a through hole formed at a predetermined position; a heat sink that may be disposed around the through hole and projects from one side of the stem; and a semiconductor laser diode mounted onto the heat sink.

18 Claims, 3 Drawing Sheets

SEMICONDUCTOR LASER DIODE PACKAGE

CROSS-REFERENCE TO RELATED PATENT APPLICATION

This application claims the benefit of Korean Patent Application No. 10-2004-0037323, filed on May 25, 2004, in the Korean Intellectual Property Office, the disclosure of which is incorporated herein in its entirety by reference.

BACKGROUND

1. Field of the Invention

The present invention relates to a semiconductor laser diode package, and more particularly, to a semiconductor laser diode package containing a high output power semiconductor laser diode with a long cavity length.

2. Description of the Related Art

Compact, low threshold current semiconductor laser diodes have been widely used in communication applications or high-speed data transmission and data recording and reading in an optical disc player.

FIG. 1 is a cross-sectional view of a conventional semiconductor laser diode package. Referring to FIG. 1, the conventional semiconductor laser diode package includes a stem 10, a heat sink 12 projecting from one side of the stem 10, a semiconductor laser diode 15 that is mounted on the heat sink 12 and generates a laser beam, and a plurality of connecting pins 11 that are fit into the other side of the stem 10 and electrically coupled to the semiconductor laser diode 15. A cap 20 is attached onto the one side of the stem 10 and covers the heat sink 12 and the semiconductor laser diode 15. A window 22 through which the laser beam emitted by the semiconductor laser diode 15 exits is attached to the center of the cap 20.

A semiconductor laser diode being developed as a light source for high-speed optical disc systems needs to have a narrow and a long cavity (e.g., greater than 1.5 mm) in order to obtain high output power and good thermal characteristics.

However, a semiconductor laser diode with a long cavity length is structurally difficult to apply to the conventional laser diode package of FIG. 1 to achieve compatibility with an existing optical system (for a semiconductor laser diode package currently being used as standardized light source for optical disc systems, the length of a stem is about 1.41 mm). Furthermore, in the case of a high power semiconductor laser diode currently being used, a very high intensity beam is emitted from the rear facet of the diode. When the high power semiconductor laser diode is applied to a conventional semiconductor laser diode package, the beam emitted from the rear facet of the laser diode is reflected and dispersed back to the light-emitting facet of the diode, causing interference between the beams. The interference will likely increase the noise level and produce unstable output.

SUMMARY

Embodiments of the present invention provide a semiconductor laser diode package containing a high output power laser diode with a long cavity length.

According to an aspect of the present invention, there may be provided a semiconductor laser diode package including: a stem having a through hole formed at a predetermined position; a heat sink that may be disposed around the through hole and projects from one side of the stem; and a semiconductor laser diode mounted onto the heat sink.

The semiconductor laser diode package may further include a filling member that may be thinner than the stem and may be packed into the through hole. The filling member may have a slanted surface adjacent to the semiconductor laser diode and be made of made of a black insulating or non-metal material.

The through hole may be cut open from the center of the stem toward an outer perimeter.

Since an end of the semiconductor laser diode may be inserted into the through hole, the semiconductor laser diode may have a cavity length greater than 1.5 mm.

The semiconductor laser diode package may further include a photodiode receiving light that may be emitted from a rear side of the semiconductor laser diode and passes through the through hole. It may also include a submount that may be disposed between the semiconductor laser diode and the heat sink and transfers heat generated within the semiconductor laser diode to the heat sink.

The package may further include a cap that may be attached to the one side of the stem and seals the heat sink and the semiconductor laser diode. The cap may have a window transmitting light emitted from a front side of the semiconductor laser diode.

The package may further include a plurality of connecting pins that may be fit into the other side of the stem and electrically connects with the semiconductor laser diode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
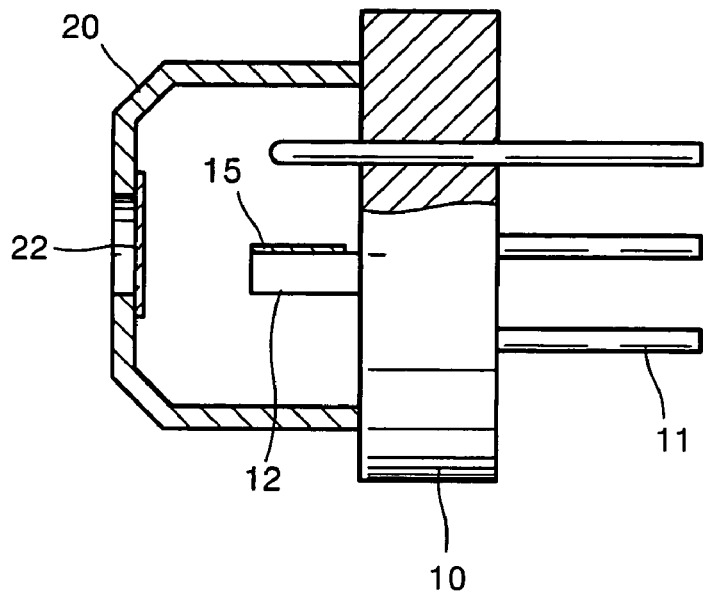
FIG. 1 is a cross-sectional view of a conventional semiconductor laser diode package to a first embodiment of the present invention.

Exemplary embodiments of the present invention will now be described more fully with reference to the accompanying drawings, in which the exemplary embodiments of the invention are shown. Like reference numerals in the drawings denote like elements, and thus their description will be omitted.

Figure 2:
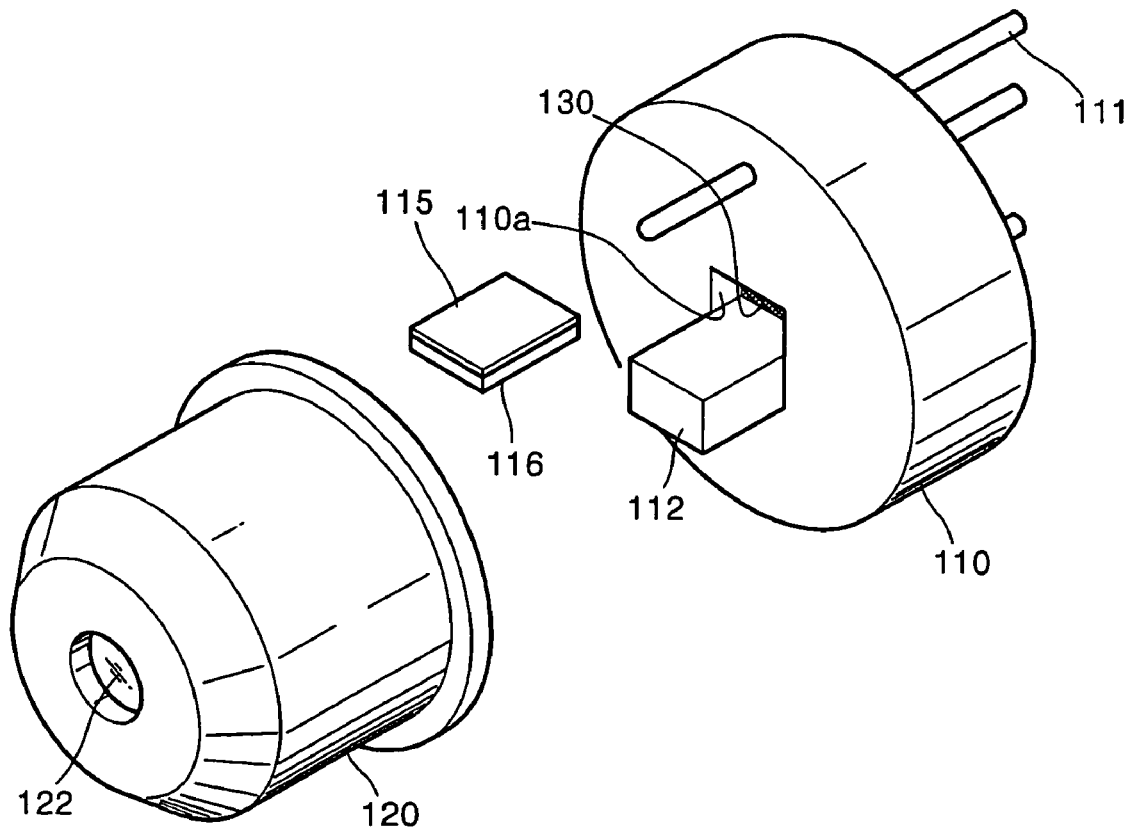
FIG. 2 is an exploded perspective view of a semiconductor laser diode package according to a first embodiment of the present invention.
Figure 3:
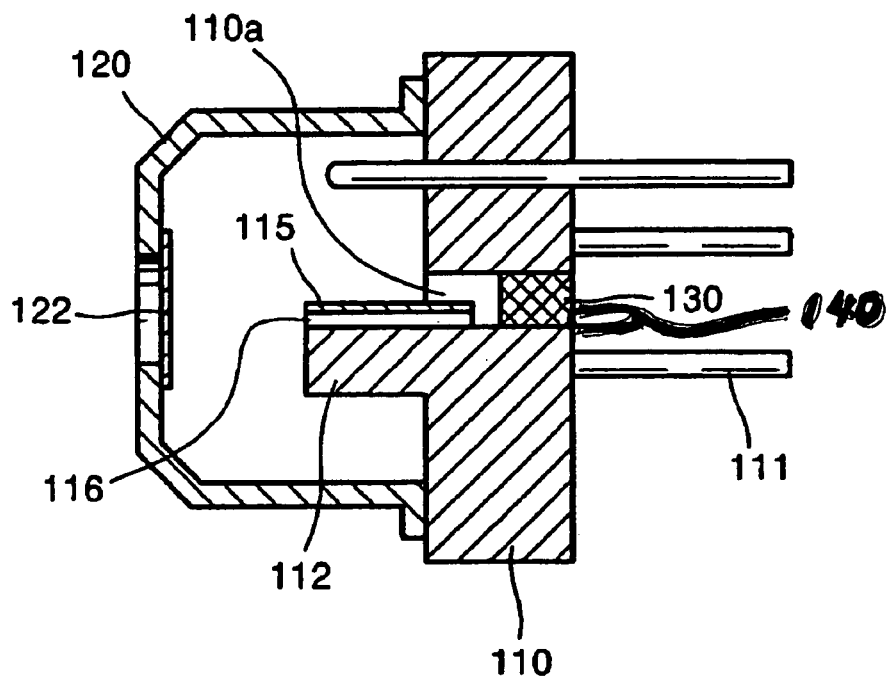
FIG. 3 is a cross-sectional view of the semiconductor laser diode package according to the first embodiment of the present invention.

Referring to FIGS. 2 and 3, a semiconductor laser diode package according to a first embodiment of the present invention may include a stem 110 having a through hole 110a formed at a predetermined position, a heat sink 112 projecting from front side of the stem 110, a semiconductor laser diode 115 mounted on the heat sink 112, and a filling member 130 packed into the through hole 110a.

More specifically, the through hole 110a with a predetermined shape such as a rectangular cross-sectional shape may be formed in the center of the stem 110. The heat sink 112 may be disposed at a lower portion of the through hole 110a in such a manner that it projects from the front side of the stem 110. The semiconductor laser diode 115 may be mounted onto the heat sink 112 and emits a laser beam. Here, since the rear end of the semiconductor laser diode 115 may be inserted into the through hole 110a, the semiconductor laser diode 115 can have a cavity longer than a conventional laser diode. The semiconductor laser diode 115 may be a high power red laser diode with a cavity length greater than about 1.5 mm.

The filling member 130 thinner than the stem 110 may be packed into the through hole 110a behind the semiconductor laser diode 115. The filling member 130 may be made of a black insulating or non-metal material and may be used to effectively absorb light emitted from the rear facet of the semiconductor laser diode 115 and reduce reflection and dispersion of the light, thereby preventing degradation in the performance of the semiconductor laser diode 115 due to optical feedback. The semiconductor laser diode package may further include a photodiode 140 that may be located around the filling member 130 and receives light that may be emitted from the rear facet of the semiconductor laser diode 115 and passes through the filling member 130. The photodiode 140 may be used to adjust and stabilize the output power of the semiconductor laser diode 115.

A submount 116 may be disposed between the semiconductor laser diode 115 and the heat sink 112 and transfers heat generated within the semiconductor laser diode 115 to the heat sink 112 and facilitates mounting of the semiconductor laser diode 115 on the heat sink 112. A cap 120 may be attached onto the front side of the stem 110 and may seal the heat sink 112 and the semiconductor laser diode 115. A window 122 may be attached to the center of the cap 120 and transmits light emitted from the front facet of the semiconductor laser diode 115. A plurality of connecting pins 111 may be fit into the rear side of the stem 120 attached to the cap 120 and electrically connects with the semiconductor laser diode 115.

Figure 4:
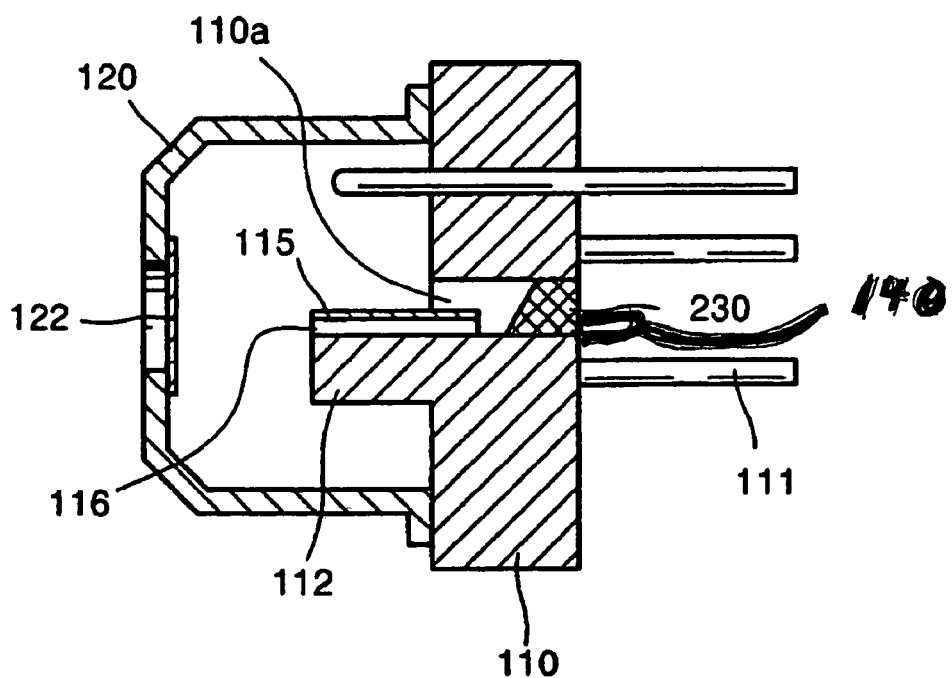
FIG. 4 is a cross-sectional view showing a modified example of the semiconductor laser diode package of FIG. 3.

FIG. 4 is a cross-sectional view showing a modified example of the semiconductor laser diode package of FIG. 3. Referring to FIG. 4, the through hole 110a formed in the stem 110 may be filled with a filling member 230 thinner than the stem 110. The filling member 230 may have a slanted surface adjacent to the semiconductor laser diode 115 such that a beam emitted from the rear facet of the semiconductor laser diode 115 is reflected from the slanted surface at a predetermined angle. That is, the filling member 230 may be used to effectively prevent degradation in the performance of the semiconductor laser diode 115 due to optical feedback.

Figure 5:
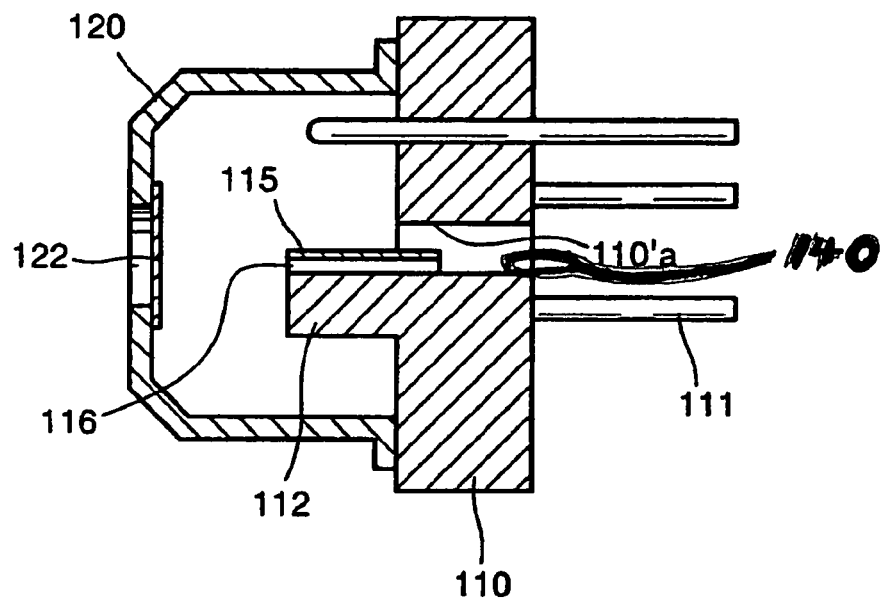
FIG. 5 is a cross-sectional view of a semiconductor laser diode package according to a second embodiment of the present invention.

FIG. 5 is a cross-sectional view of a semiconductor laser diode package according to a second embodiment of the present invention. A difference from the first embodiment will now be described. Referring to FIG. 5, a through hole 110'a having a predetermined shape may be formed in the center of a stem 110. Unlike in the first embodiment, the through hole 110'a is not filled with any filling member. A heat sink 112 may be disposed at a lower portion of the through hole 110'a in such a manner that it projects from front side of the stem 110. A semiconductor laser diode 115 emitting a laser beam may be mounted onto the heat sink 112 in such a way that its rear end may be inserted into the through hole 110'a. Thus, the semiconductor laser diode 115 can have a cavity longer than a conventional laser diode. Furthermore, since light emitted from the rear facet of the semiconductor laser diode 115 passes through the through hole 110'a, it is possible to prevent reflection of the light by the stem 110. The semiconductor laser diode package may further include a photodiode 140 that may be located around the through hole 110'a and receives light that may be emitted from the rear facet of the semiconductor laser diode 115 and passes through the through hole 110'a.

Figure 6:
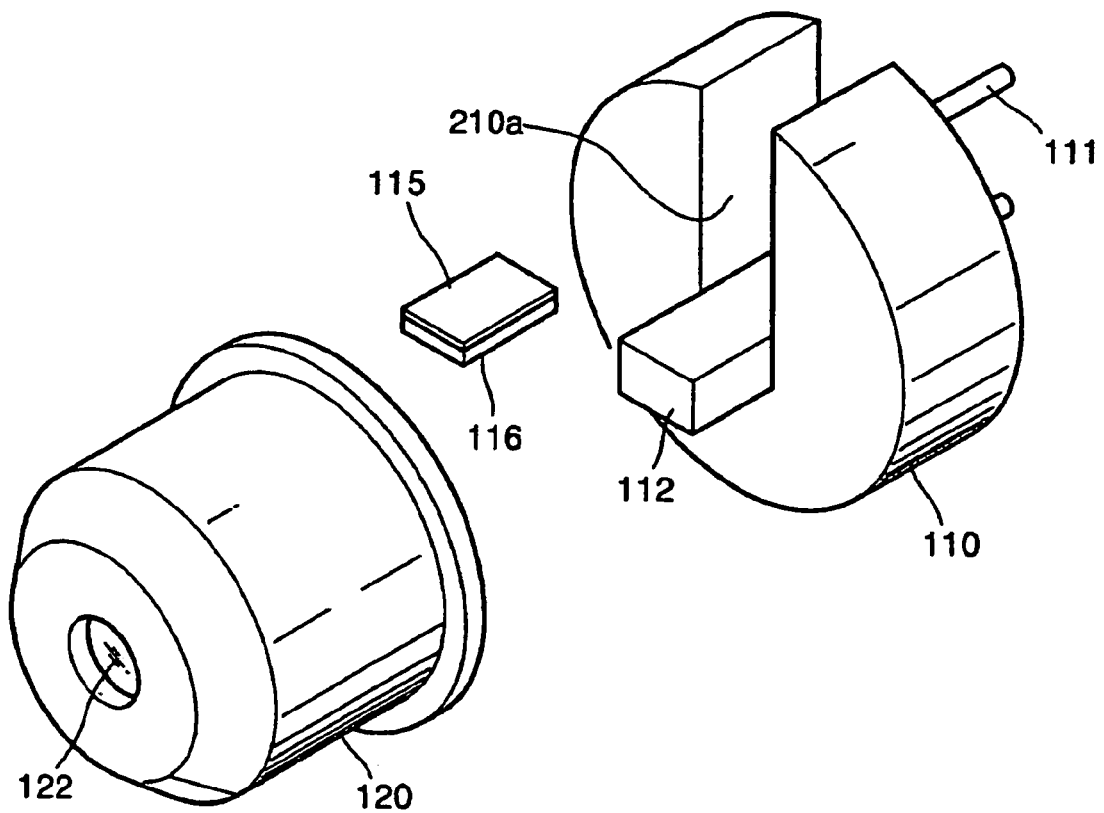
FIG. 6 is an exploded perspective view of a semiconductor laser diode package according to a third embodiment of the present invention.

FIG. 6 is an exploded perspective view of a semiconductor laser diode package according to a third embodiment of the present invention. A difference from the previously described embodiments will now be described. Referring to FIG. 6, a through hole 210a may be cut open from the center of a stem 110 toward the outer perimeter. A heat sink 112 may be disposed at a lower portion of the through hole 210a in such a manner that it projects from one side of the stem 110. A semiconductor laser diode 115 is mounted onto the heat sink 112 in such a way that its rear end may be inserted into the through hole 210a. Thus, the high output power semiconductor laser diode 115 can have a cavity longer than a conventional laser diode. Furthermore, since light emitted from the rear facet of the semiconductor laser diode 115 passes through the through hole 210a, it is possible to prevent reflection of the light by the stem 110. The semiconductor laser diode package may further include a photodiode (not shown in FIG. 6) that may be located around the through hole 210a and receives light that may be emitted from the rear facet of the semiconductor laser diode 115 and passes through the through hole 210a.

As described above, a semiconductor laser diode package according to the present invention has a stem with a through hole into which a part of a semiconductor laser diode may be inserted, thereby achieving compatibility with the existing optical system while allowing the use of a high power semiconductor laser diode with a longer cavity length. Another advantage may be to reduce or suppress reflection and dispersion of light emitted from the rear facet of the semiconductor laser diode, thereby preventing degradation in optical performance due to optical feedback.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor laser diode package, comprising:
   a stem having a first surface and a second surface opposing the first surface and including a through hole formed to extend from the first surface to the second surface at a predetermined position;
   a heat sink projecting from the first surface of the stem and having a mounting surface connected to the through hole; and
   a semiconductor laser diode mounted onto mounting surface of the heat sink such that a cavity length direction of the semiconductor laser diode coincides with the extending direction of the through hole,
   wherein an end portion of the semiconductor laser diode is mounted within the through hole.

2. The package of claim 1, further comprising a filling member that fills into the through hole part way in a thickness direction of the stem.

3. The package of claim 2, wherein the filling member has a slanted surface adjacent to the semiconductor laser diode.

4. The package of claim 2, wherein the filling member is made of an insulating or non-metal material.

5. The package of claim 4, wherein the filling member is made of a light absorbing material.

6. The package of claim 1, wherein the semiconductor laser diode has a cavity length greater than 1.5 mm.

7. The package of claim 1, further comprising a photodiode receiving light that is emitted from a rear side of the semiconductor laser diode and passes through the through hole.

8. The package of claim 1, further comprising a submount that is disposed between the semiconductor laser diode and the heat sink and transfers heat generated within the semiconductor laser diode to the heat sink.

9. The package of claim 1, further comprising a cap that is attached to the first surface of the stem and seals the heat sink and the semiconductor laser diode.

10. The package of claim 9, wherein the cap has a window transmitting light emitted from a front side of the semiconductor laser diode.

11. The package of claim 1, further comprising a plurality of connecting pins that is fit into the second surface of the stem and electrically connects with the semiconductor laser diode.

12. The package of claim 1, further comprising a filling member disposed in the through hole adjacent to the end portion of the semiconductor laser diode.

13. The package of claim 12, wherein the filling member is configured to absorb light emitted from the end portion of the semiconductor laser diode.

14. The package of claim 13, wherein the filling member allows a portion of the light emitted from the end portion of the semiconductor laser diode to pass through, the package further comprising a photodiode disposed in a vicinity of the through hole and behind the filling member, wherein the photodiode is configured to adjust an output power of the semiconductor laser diode based on the portion of the light emitted from the end portion of the semiconductor laser diode that passes through the filling member.

15. The package of claim 12, wherein the filling member is configured to reflect the light emitted from the end portion of the semiconductor laser diode at a predetermined angle.

16. The package of claim 15, wherein the filling member allows a portion the light emitted from the end portion of the semiconductor laser diode to pass through, the package further comprising a photodiode disposed in a vicinity of the through hole and behind the filling member, wherein the photodiode is configured to adjust an output power of the semiconductor laser diode based on the portion of the light emitted from the end portion of the semiconductor laser diode that passes through the filling member.

17. The package of claim 12, further comprising a photodiode disposed in a vicinity of the through hole and behind the end portion of the semiconductor laser diode, wherein the photodiode is configured to adjust an output power of the semiconductor laser diode based on light emitted from the end portion of the semiconductor laser diode.

18. The package of claim 12, further comprising a submount disposed between the semiconductor laser diode and the heat sink and configured to transfer heat generated from the semiconductor laser diode to the heat sink.

* * * * *